United States Patent
Rawat et al.

(10) Patent No.: US 10,032,506 B2
(45) Date of Patent: Jul. 24, 2018

(54) CONFIGURABLE PSEUDO DUAL PORT ARCHITECTURE FOR USE WITH SINGLE PORT SRAM

(71) Applicant: STMicroelectronics International N.V., Amsterdam (NL)

(72) Inventors: Harsh Rawat, Haryana (IN); Abhishek Pathak, Nowgong (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/375,987

(22) Filed: Dec. 12, 2016

(65) Prior Publication Data

US 2018/0166128 A1    Jun. 14, 2018

(51) Int. Cl.
| | |
|---|---|
| G11C 7/22 | (2006.01) |
| G11C 7/06 | (2006.01) |
| G11C 11/419 | (2006.01) |
| G11C 11/418 | (2006.01) |
| G06F 1/06 | (2006.01) |
| G06F 13/16 | (2006.01) |

(52) U.S. Cl.
CPC .............. *G11C 11/419* (2013.01); *G06F 1/06* (2013.01); *G06F 13/1689* (2013.01); *G11C 11/418* (2013.01)

(58) Field of Classification Search
CPC ....... G11C 7/1075; G11C 7/1072; G11C 7/22; G11C 7/106; G11C 7/1087; G11C 7/222; G11C 8/16; G11C 7/1051
See application file for complete search history.

(56) References Cited

U.S. PATENT DOCUMENTS

| | | | |
|---|---|---|---|
| 6,134,154 A | 10/2000 | Iwaki et al. | |
| 6,882,562 B2 | 4/2005 | Beucler | |
| 7,251,193 B2 | 7/2007 | Jung | |
| 7,643,330 B1 | 1/2010 | Lin et al. | |
| 7,808,847 B2* | 10/2010 | Wang ................ | G11C 29/818 365/200 |
| 7,870,310 B2* | 1/2011 | Au ..................... | G06F 5/065 326/38 |
| 8,144,537 B2* | 3/2012 | Mishra .............. | G11C 7/02 365/203 |
| 8,370,557 B2 | 2/2013 | Dama et al. | |
| 8,570,818 B2 | 10/2013 | Jung et al. | |
| 9,064,556 B2 | 6/2015 | Gulati et al. | |
| 9,214,222 B2* | 12/2015 | Ishii .................. | G11C 7/222 |
| 9,230,622 B2 | 1/2016 | Wu et al. | |
| 9,311,990 B1 | 4/2016 | Rawat et al. | |
| 9,324,416 B2* | 4/2016 | Yoon ................. | G11C 7/222 |
| 2004/0190364 A1 | 9/2004 | Jung | |

* cited by examiner

*Primary Examiner* — Hien Nguyen
(74) *Attorney, Agent, or Firm* — Crowe & Dunlevy

(57) ABSTRACT

A memory array has word lines and bit lines. A row decoder is operable to decode a row address and select a corresponding word line. A read-write clock generator is operable to generate a hold clock signal. An address clock generator receives a read address, a write address, a dual port mode control signal, a read chip select signal, and a write chip select signal. When operating in dual port mode, and when operating in a read mode, the address clock generator applies a read delay to the read address and outputs the read address, as delayed, to the row pre-decoder as the address in response to the hold clock signal.

21 Claims, 13 Drawing Sheets

CONFIGURABLE PSEUDO DUAL PORT ARCHITECTURE FOR USE WITH SINGLE PORT SRAM

TECHNICAL FIELD

This application related to the field of control circuitry for random access memory, and, more particularly, control circuitry that enables a single port SRAM to act as a dual port SRAM.

BACKGROUND

Single port memory is capable of performing a single operation, such as a read or a write, at a time. On the other hand, dual port memory is capable of performing multiple operations, such as a read and a write, substantially simultaneously.

Dual port memory consumes substantially more chip area and is substantially more complex and costly from development and qualification point of view as compared to single port memory. This is because dual port memory typically has two separate address buses, with one being for a read address and the other being for a write address, as well as two separate data buses, with one being for data read out from the memory and the other being for data written to the memory.

Due to its ability to read and write simultaneously, dual port memory is therefore desirable over single port memory for some applications. However, since the extra space consumed by dual port memory may be undesirable, designs have been derived that provide the functionality of dual port memory while not consuming substantially more surface area than single port memory.

These designs are known as pseudo dual port memory. However, such designs come with their own drawbacks. For example, such designs tend to be substantially slower than true dual port memory. In addition, such designs lose the capability of operating in single port mode, meaning that they cannot selectively operate in single port mode when desired. This also avoids the development of a separate compiler for single port memory.

Therefore, it is clear that further development in the area of pseudo dual port memory design is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a memory controller for a memory array having word lines and bit lines. The memory controller includes a row decoder configured to decode a row address and select a word line corresponding to the decoded row address, a row pre-decoder configured to output an address to the row decoder as the row address, and a read-write clock generator configured to generate clocks to the row decoder and a input/output (IO) block, and read or write address selection signal to start a read or write operation depending on the mode of operation. An address clock generator is configured to receive a read address, a write address, a dual port mode control signal, a read chip select signal, and a write chip select signal. The address clock generator, when operating in dual port mode as indicated by the dual port control signal, and when operating in a read mode as indicated by the read chip select signal, is configured to apply read address signal to the row pre-decoder and column pre-decoder as the address. The address clock generator, when operating in dual port mode as indicated by the dual port control signal, and when operating in a write mode as indicated by the write chip select signal, is configured to apply a write delay to the write address and output the write address signal-to the row pre-decoder and column pre-decoder as the address, in response to the hold clock signal generated in the first read mode cycle. When operating in dual port mode, the hold clock generated in a write operation applies a next read address signal to the row pre-decoder and column address as the address.

DETAILED DESCRIPTION

Figure 1:
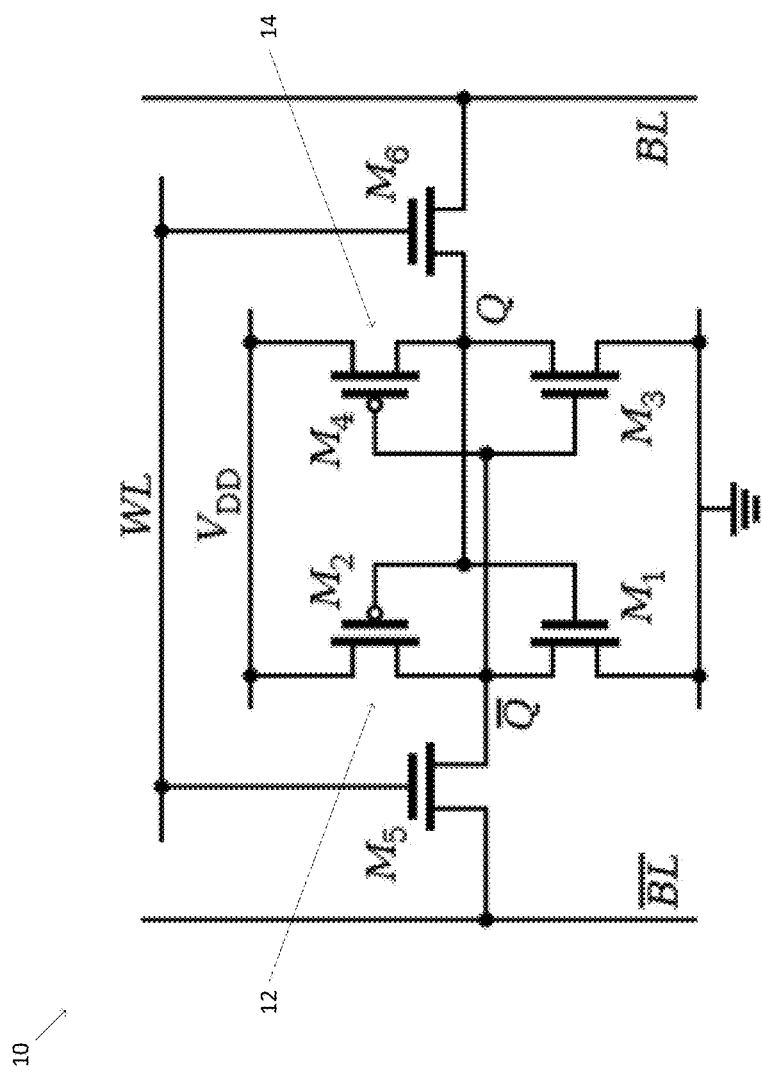
FIG. 1 is a schematic of a six transistor SRAM cell.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout, as well as reference numbers with prime notation, may indicate similar elements in other applications or embodiments.

Disclosed herein is a memory controller or control circuitry that functions to enable an array of six transistor SRAM cells to function in a pseudo dual-port mode. First, with reference to FIG. 1, a sample six transistor SRAM cell 10 is now described. The SRAM cell 10 is comprised of six MOSFETs, M1-M6. Transistors M1-M2 form a first inverter 12, and transistors M3-M4 form a second inverter 14. The inverters 12 and 14 are cross-coupled. Each bit of data is stored on the transistors M1-M4 forming the inverters 12 and 14. Transistors M5 and M6 control access to the memory cell 10 during read and write operations. Access to the memory cell 10 is enabled by the word line WL which controls the two access transistors M5 and M6 which, in turn, control whether the memory cell 10 is connected to the bit lines BL and BL. Bit lines BL and BL are used to transfer data for both read and write operations. During read accesses, the bit lines BL and BL are actively driven high and low by the inverters 12 and 14, permitting readout.

Figure 2:
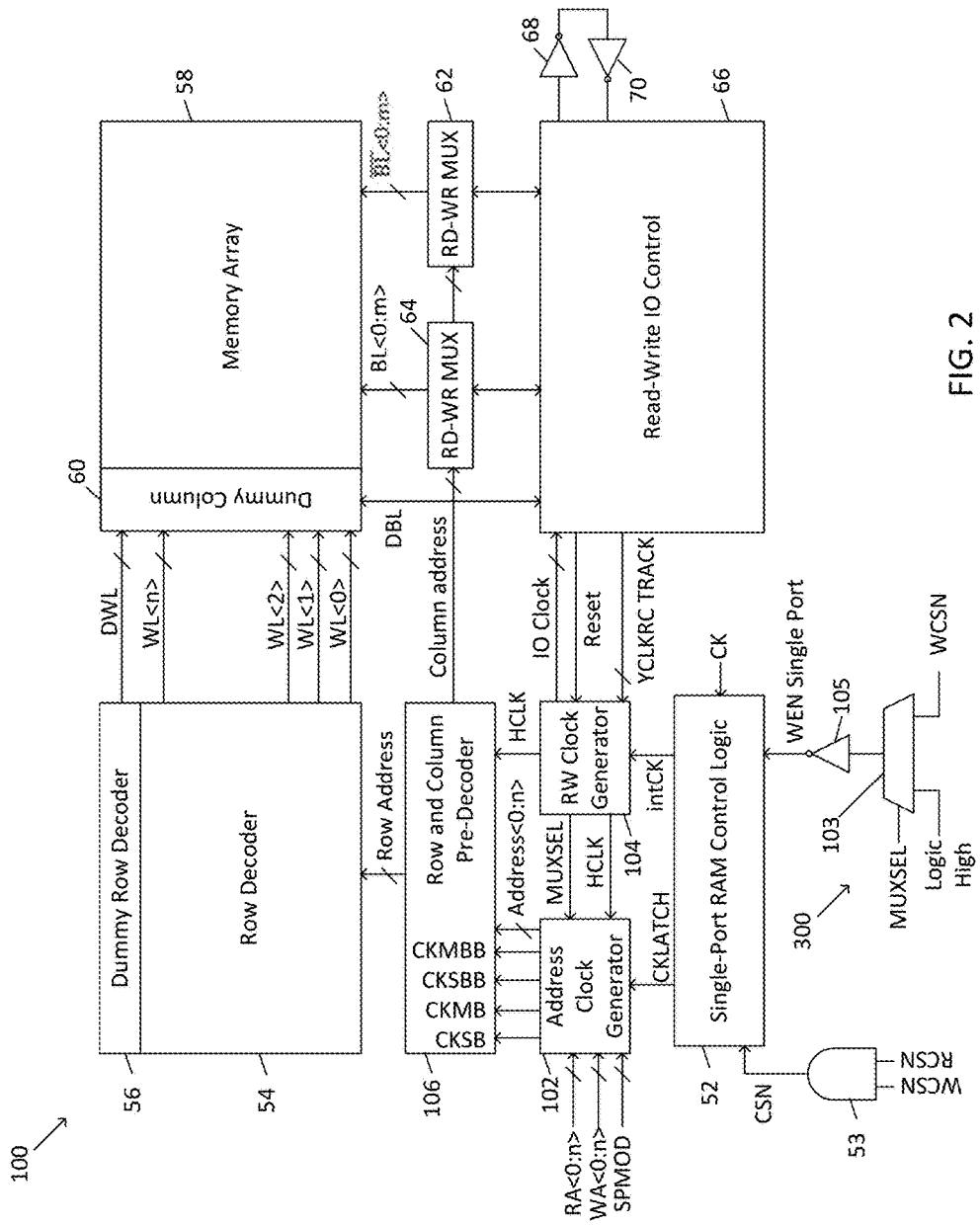
FIG. 2 is a system level block diagram of pseudo dual port control circuitry capable of converting single port memory to pseudo dual port operation, yet maintaining the ability to revert to single port mode.

With reference to FIG. 2, the control circuitry or memory controller 100, as coupled to a memory array 58, is now described. The memory array 58 is an array of six transistor SRAM cells, as described above with reference to FIG. 1, and includes at least one dummy column 60. The memory array 58 is accessed via word lines WL<0:n>, and bit lines BL<0:m> and $\overline{BL}$<0:m>.

A single port RAM control logic 52, due to its single port nature, is configured to either operate in read mode or in write mode. The single port RAM control logic 52 is enabled or disabled by the chip select signal CSN, which is generated by coupling of a write chip select signal WCSN and a read chip select signal RCSN to AND gate 53, which passes the result as CSN. The single port RAM control logic 52 receives the device clock CK.

The single port RAM control logic 52 functions to generate clock signal CKLATCH and intCK for use by the address clock generator 102 and read-write clock generator 104.

It should be understood that the memory control circuit 100 can be configured to operate in one of four modes. When operating in pseudo-dual port mode, RCSN and WCSN are both asserted, which in the illustrated embodiments is as a logic low. When operating in single port mode and performing a read, RCSN is asserted, while WCSN is deasserted. Similarly, when operating in single port mode and performing a write, WCSN is asserted, while RCSN is deasserted. Where no operations are to be performed, RCSN and WCSN are both deasserted.

Port control circuitry 300 controls which mode the single port ram control logic 52 is operating in, and includes a multiplexer 103 controlled by a multiplexer select signal MUXSEL, that serves to multiplex either a logic high or WCSN to inverter 105, which passes the received signal as the write enable signal WEN to the single port ram control logic 52. When a read and a write operation are to be performed (i.e. operation in pseudo-dual port mode), the read is performed first. Therefore, where a read is to be performed, MUXSEL is low, and a logic high is passed as WEN. If a write is to be performed after the read, WCSN will be low, and a logic low is thus passed as WEN.

Figure 7:
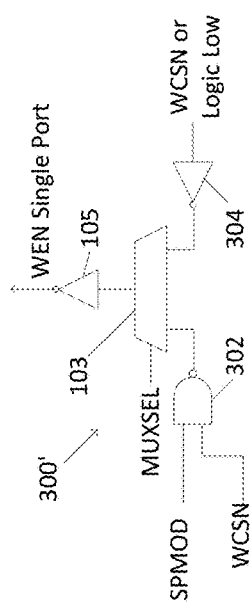
FIG. 7 is alternate single port mode control circuitry for use in FIG. 2.

Alternate port control circuitry 300' is now described with reference to FIG. 7. Here, the port control circuitry 300' includes NAND gate 302 which performs a logical NAND operation of the single port mode signal SPMOD and the write enable signal WEN, and provides its output to multiplexer 103. The write enable signal WEN or a logic low signal is inverted by inverter 304, and provided to multiplexer 103 as a second input. The multiplexer 103 provides its output through inverter 105, which passes the received signal as WEN to the single port ram control logic 52.

The read-write clock generator 104 generates the internal signal intCK which initiates read and write operations depending on the mode of operation. HCLK is the delayed version of intCK, which is used in generation of the MUX-SEL signal. The MUXSEL signal selects the address to be passed inside to the row/column pre-decoders.

The read-write clock generator 104 also receives the RC (resistance and capacitance load of metal and device) tracking signal YCLKRC-TRACK and RESET, which are used in the generation of internal clock intCK again in the same cycle for a write operation after a read operation. The YCLKRC-TRACK signal tracks the complete resetting of column address and IO signal of the first read operation. The RESET (selftime reset) signal is generated from dummy column block '60' shown in FIG. 2, and helps ensure successful read and write operations. Using both RESET and YCLKRC-TRACK signals in generation of the second intCK avoids the overlap of signals between read and write operation, which in turn avoids the corruption of the memory's stored data. The READY signal is generated using both YCLKRC-TRACK and RESET signals. Generation of READY signal trigger intCK is performed again for the write operation, when operating in dual port mode.

The address clock generator 102 receives the read address RA<0:n>, if any, where data is to be read from, and receives the write address WA<0:n>, if any, where data is to be written to. The address clock generator 102 also receives a control signal SPMOD indicating whether the circuitry 100 is to operate in single port mode or pseudo dual port mode.

The address clock generator 102, when operating in dual port mode as indicated by SPMOD, and in read mode as indicated by RCSN, is configured to latch the read address signal RA<0:n> and output the read address signal RA<0:n> to row and column pre-decoder 106, as a function of MUXSEL. When operating in dual port mode as indicated by SPMOD and in write mode as indicated by WCSN, the address clock generator 102 latches the write address signal WA<0:n> and outputs the write address signal WA<0:n> to row and column pre-decoder 106, as a function of MUX-SEL. The address clock generator generates clock signals CKSB, CKMB, CKSBB, and CKMBB from clock signal CKLATCH, and outputs them to row and column pre-decoder 106.

The row and column pre-decoder 106 serves to output the row address received from the address clock generator 102 to row decoder 54, and the corresponding column addresses to the read-write multiplexers 64, 62, for use in readout or writing to the memory array 58. The appropriate data is then read from, or written to, the memory array 58 via the bit lines BL<0:m> and $\overline{BL}$<0:m>.

The read-write IO control 66 controls the read-write multiplexers 64, 62, and generates the RC tracking signal YCLKRC TRACK.

Figure 5:
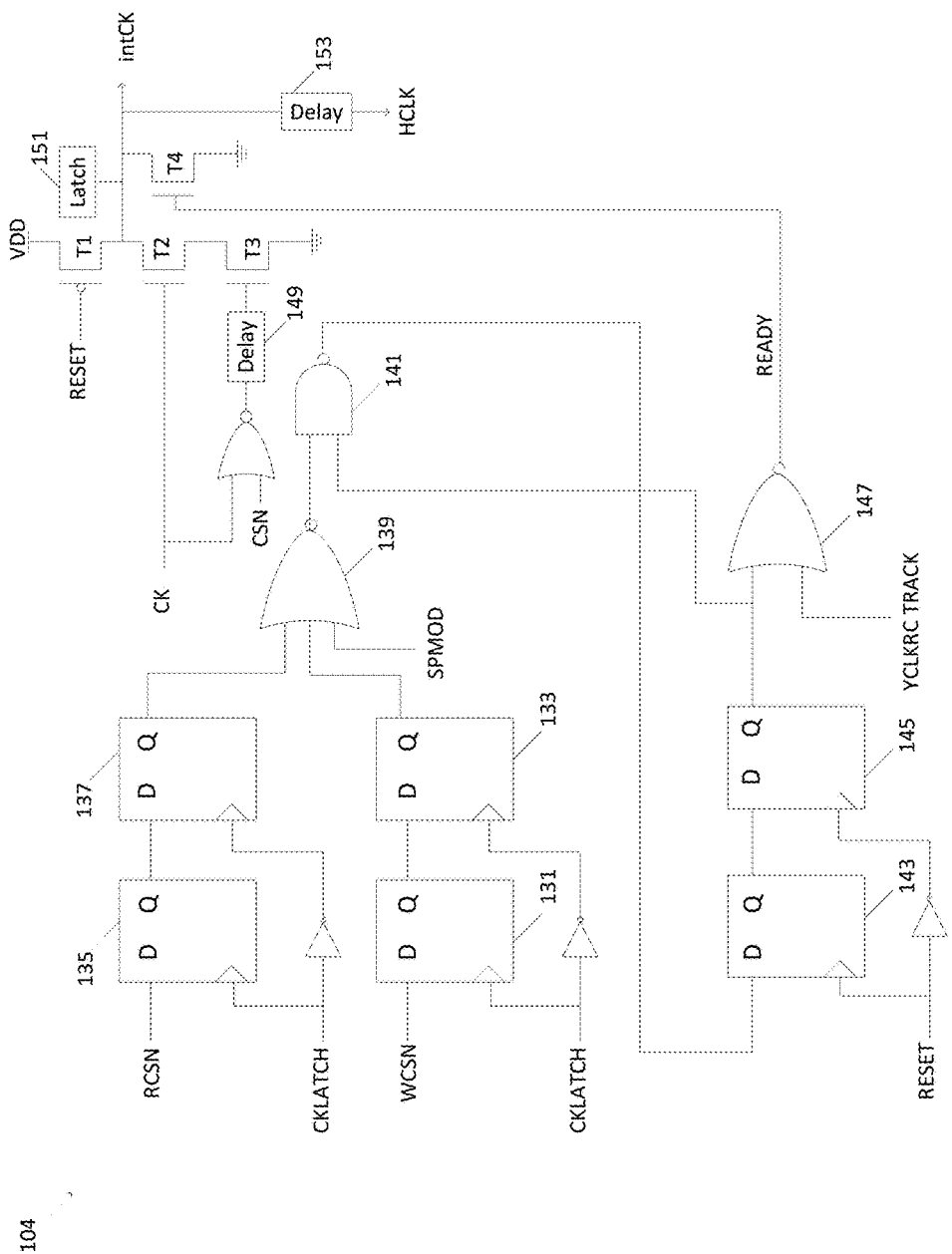
FIG. 5 is a schematic block diagram of read-write clock generator of FIG. 2.

With additional reference to FIG. 5, in greater detail, the read-write clock generator 104 includes a first master-slave flop chain comprised of latches 131, 133 configured to receive WCSN and being clocked by CKLATCH and an inverse thereof, which provides output to NOR gate 139. A second master-slave flop chain comprised of latches 135, 137 configured to receive RCSN and being clocked by the latch clock and the inverse thereof, provides output to NOR gate 139 as well. The NOR gate 139 also receives the single port mode signal SPMOD as input, and provides its output to NAND gate 141.

The NAND gate 141 also receives input from an output of a master-slave latch chain comprised of latches 143, 145 clocked by reset signal RESET and an inverse thereof. The output of NAND gate 141 is provided as input to latch 143. NOR gate 147 receives input from latch 145, as well as the RC tracking signal YCLKRC TRACK.

PMOS transistor T1 has its source coupled to power supply node VDD, its drain coupled to the drain of NMOS transistor T2, and its gate coupled to the reset signal RESET. NMOS transistor has its source coupled to the drain of NMOS transistor T3, and its gate coupled to the clock signal CK. NMOS transistor T3 has its source coupled to ground, and its gate coupled to a delayed version of CK 149.

Latch 151 is coupled to the drain of PMOS transistor T1, as is the drain of NMOS transistor T4. NMOS transistor T4 has its source coupled to ground and its gate coupled to receive the output from the NAND gate 147. The internal clock signal intCK is generated at the drain of PMOS transistor T1 and drain of NMOS transistor T4, and then delayed by block 153, for output as the hold clock signal HCLK.

Figure 8:
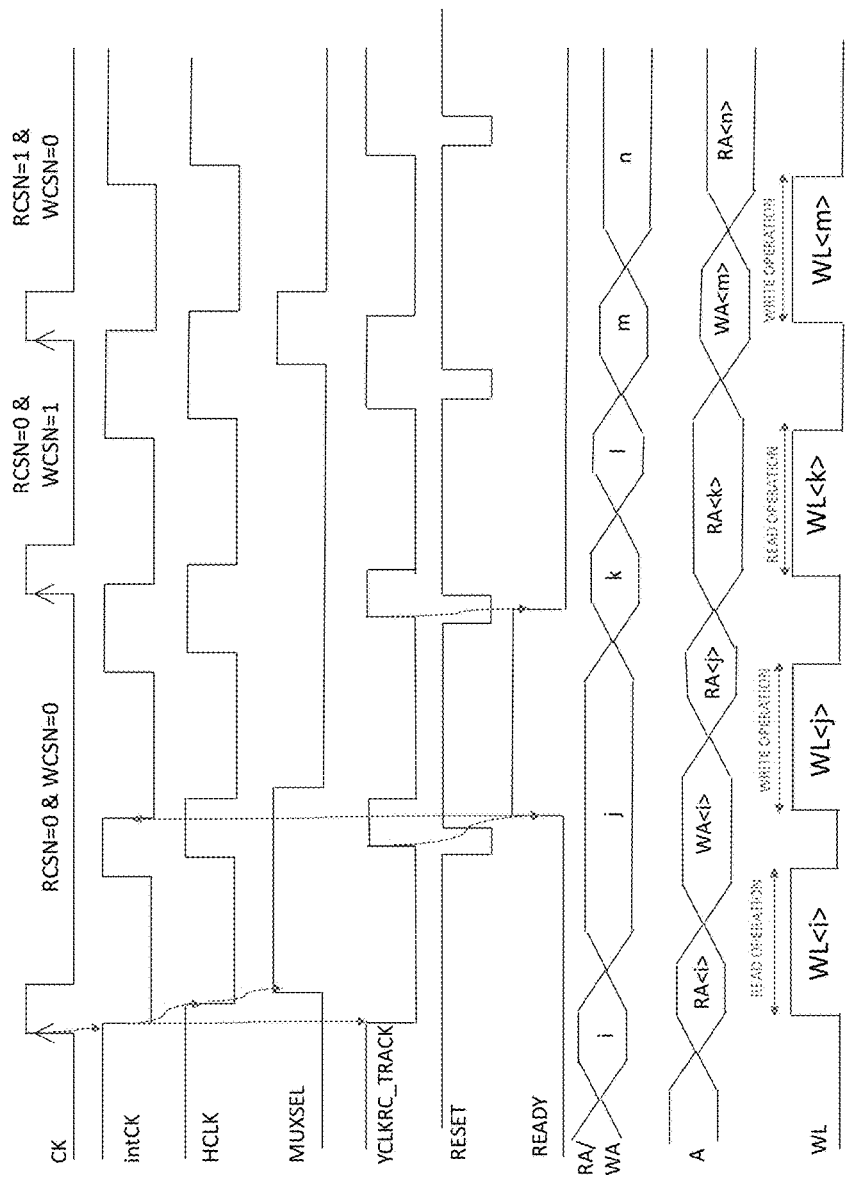
FIG. 8 is a timing diagram showing operation of the block diagram of FIG. 2 in operation.

The resulting timing of the hold clock signal HCLK, relative to the device clock CK and internal clock intCK signal, can be seen in FIG. 8. As can be seen, HCLK is a delayed version of intCK, and this delay is aligned with the hold time delay needed to latch the address to be written to or read from in the word line latches. This delay between HCLK and intCK is short, since the address can be changed once the hold clock HCLK causes the latching.

This effectively means that a next address can be released as soon as hold clock HCLK is generated. Since in pseudo-dual port mode a read is performed prior to a write, this means that the write address WA<0:n> can be released, via MUXSEL, as soon as hold clock goes low during the read operation. This fast release of the write address WA<0:n> during the read operation helps ensure that the write address WA<0:n> settled prior to the write operation itself being triggered by the internal clock intCK. This provides a substantial increase in speed compared to prior pseudo-dual port designs.

Figure 3:
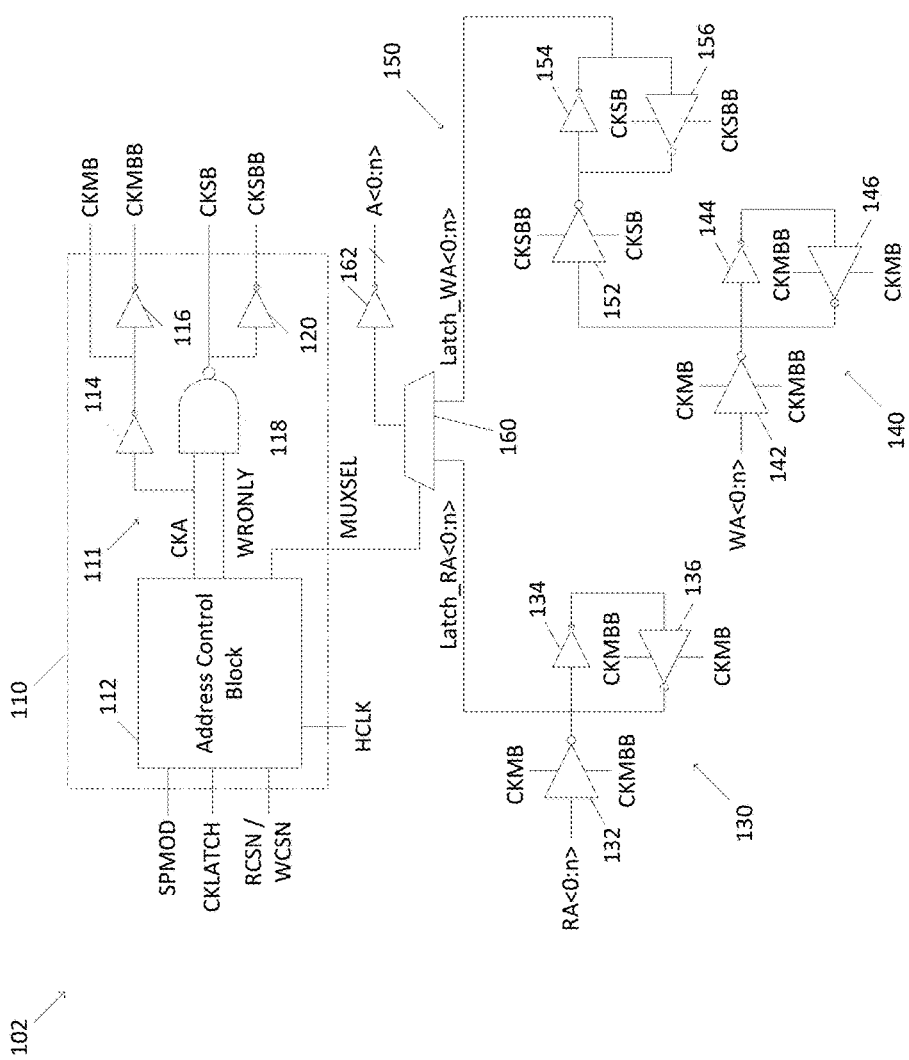
FIG. 3 is a schematic block diagram of the address clock generator of FIG. 2.

Details of the address clock generator 102 will now be given with additional reference to FIG. 3. The address clock generator 102 includes address control circuitry 110 configured to receive RCSN and WCSN, and in response thereto, generate address clock signals CKMB, CKMBB, CKSB, CKSBB, as well as MUXSEL. The address clock generator 102 includes a multiplexer configured to multiplex the latched read address signal and the latched write address signal to the row pre-decoder as the address, under control of MUXSEL.

The address control circuit 110 itself includes an address control block 112 configured to receive RCSN and WCSN, and in response thereto, generate a first clock output CKA and a write only signal WRONLY. The block 111 generates the clock signals CKMB, CKMBB, CKSB, CKSBB, as well as MUXSEL from the first clock output CKA and the write only signal WRONLY.

The block 111 is comprised of a first inverter 114 receiving the first clock output CKA and generating therefrom a second clock output CKMB. A second inverter 116 is coupled to receive the second clock output CKMB and to generate therefrom a third clock output CKMBB. A NAND gate 118 receives the first clock output CKA and the write only signal WRONLY, and generates therefrom a fourth clock output CKSB. A third inverter 120 is coupled to the output of the NAND gate 118 to generate a fifth clock output CKSBB.

Figure 4:
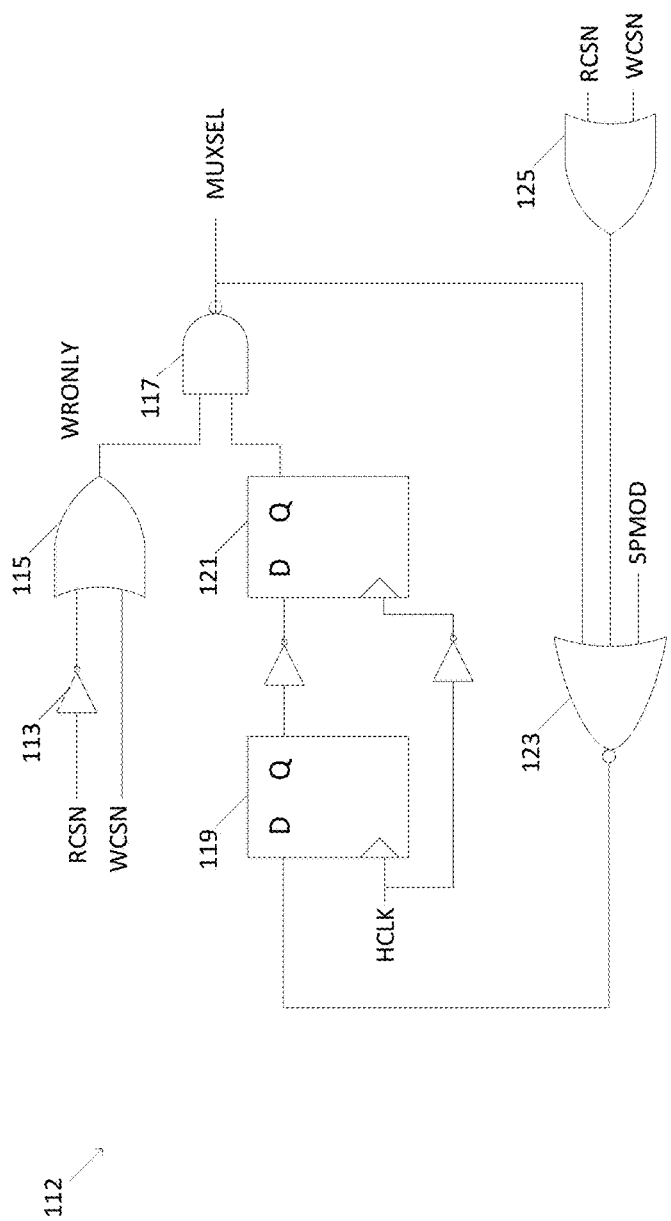
FIG. 4 is a schematic block diagram of the address control block of the address clock generator of FIG. 2.

The address control block 112, with additional reference to FIG. 4, includes OR gate 115 coupled to receive RCSN as inverted by inverter 113, and WCSN. The output of OR gate 115 is the write only signal WRONLY. NAND gate 117 is coupled to receive the output from OR gate 115.

Latch 119 receives output from NOR gate 123 and is clocked by HCLK. Output of latch 119 is inverted and fed to the input of latch 121, which is clocked by an inverse of HCLK. The NAND gate 117 receives output from latch 121, and produces MUXSEL at its output. OR gate 125 receives WCSN and RCSN, and provides output to NOR gate 123. NOR gate 123 also receives the single port mode signal SPMOD as input, and provides output to latch 119.

A read latch circuit 130 receives the read address RA<0:n> and latches the read address RA<0:n> for output to the multiplexer 160. A write master latch circuit 140 and write slave latch circuit 150 arrangement receive the write address WA<0:n> for output to the multiplexer 160 until completion of a write operation. As will be explained, the write address WA<0:n> is latched prior to completion of the read operation, so that when the write operation begins, the write address WA<0:n> is already attached.

The read latch circuit 130 includes a first clocked inverter 132 having a data input receiving the read address RA<0:n> as input, a first clock input receiving the second clock output CKMB, and a second clock input receiving the third clock output CKMBB. Inverter 134 receives output from the first clocked inverter 132. A second clocked inverter 136 has a data input coupled to receive output from the inverter 134, a first clock input receiving the third clock output CKMBB, a second clock input receiving the second clock output CKMB, and an output coupled to the multiplexer 160.

The master write latch circuit 140 includes a first clocked inverter 142 having a data input receiving a bit of the write address WA<0:n> as input, a first clock input receiving the second clock output CKMB, and a second clock input receiving the third clock output CKMBB. An inverter 144 is coupled to receive output from the first clocked inverter 142. A second clocked inverter 146 has a data input coupled to receive output from the inverter 144, a first clock input receiving the third clock output CKMBB, a second clock input receiving the second clock output CKMB, and an output coupled to the data input of the slave write latch 150.

The slave write latch circuit 150 includes a third clocked inverter 152 having a data input coupled to receive output from the second clocked inverter 146, a first clock input receiving the fifth clock output CKSBB, and a second clock input receiving the fourth clock output CKSB. A second inverter 154 receive output from the third clocked inverter 152. A fourth clocked inverter 156 has a data input coupled to receive output from the second inverter 154, a first clock input receiving the fourth clock output CKSB, a second clock input receiving the fifth clock output CKSBB, and an output coupled to the multiplexer 160.

As will be understood by those of skill in the art, the above latching of the read and write addresses have been described with reference to one bit. The above described master read latch circuit 130, master write latch circuit 140, and slave write latch circuit 150 are replied for each bit of the read and write addresses.

Figure 9:
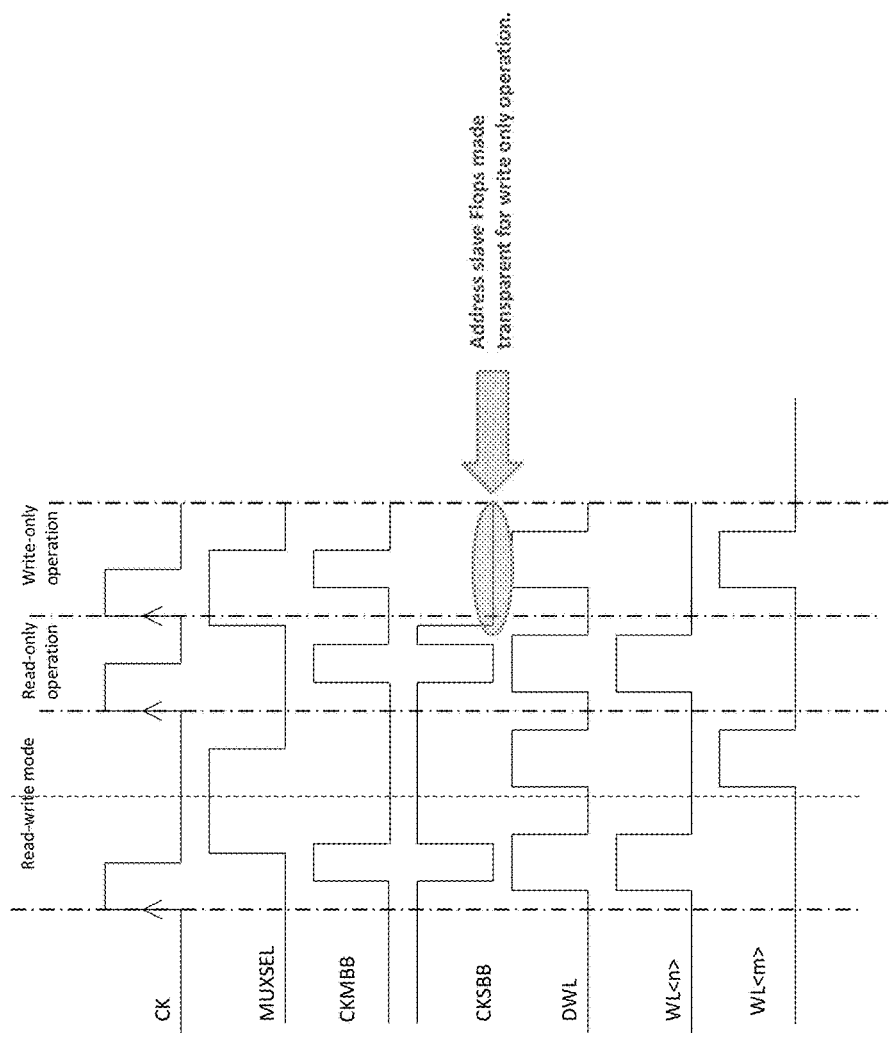
FIG. 9 is a timing diagram showing generation of the address clock signals.

As can be seen, the read address RA<0:n> is always taken from the master write latch 130. The write address WA<0:n> is taken from the slave write latch 150, however, as shown through the use of the write only signal WRONLY in the address control circuit 110, and the subsequent generation of CKSB and CKSBB, the slave write latch 150 in the case of a write only operation becomes transparent, as shown in FIG. 9. This enables settlement of the write address to the row-decoder and to the IO block, before arrival of external clock CK to start a write operation.

Figure 10:
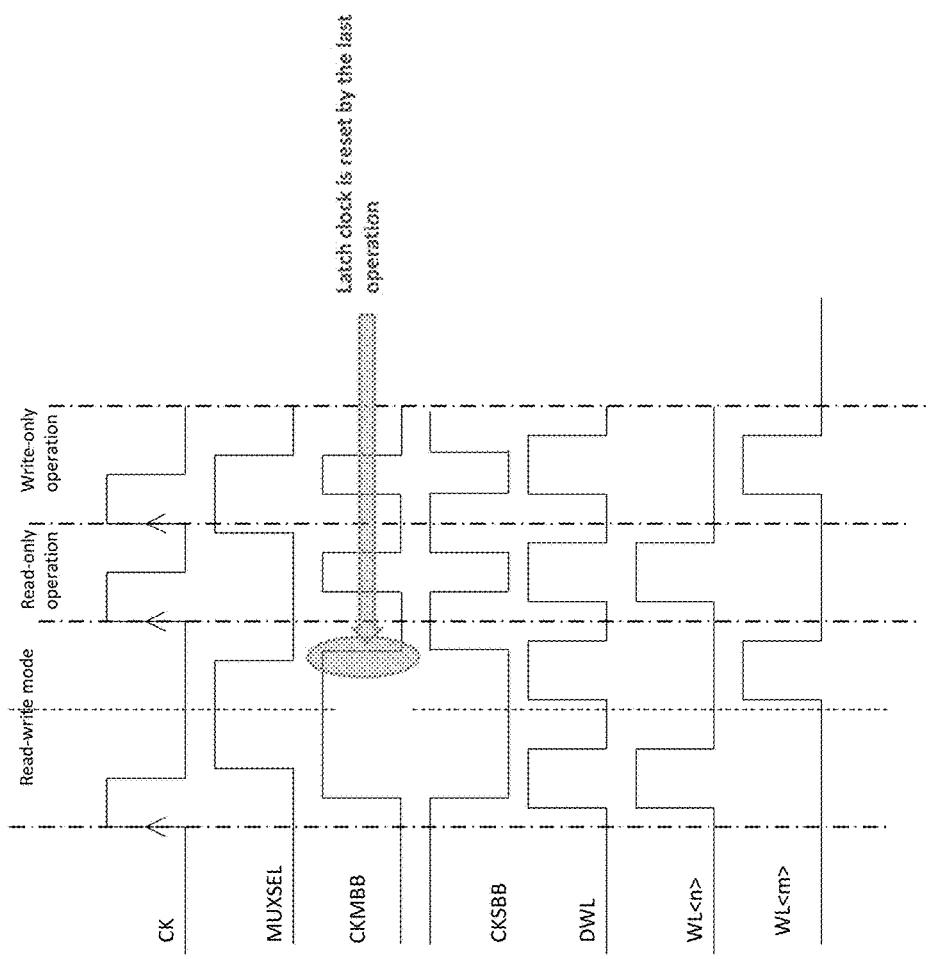
FIG. 10 is another timing diagram showing generation of the address clock signals.

Alternatively, as shown in FIG. 10, CKMBB and CKSBB can be generated as large pulses for the latches so as to cover completion of both the read and the write operations. When operating in pseudo-dual port mode, the reset for CKMBB and CKSBB can come from a write selftime reset.

Figure 6:
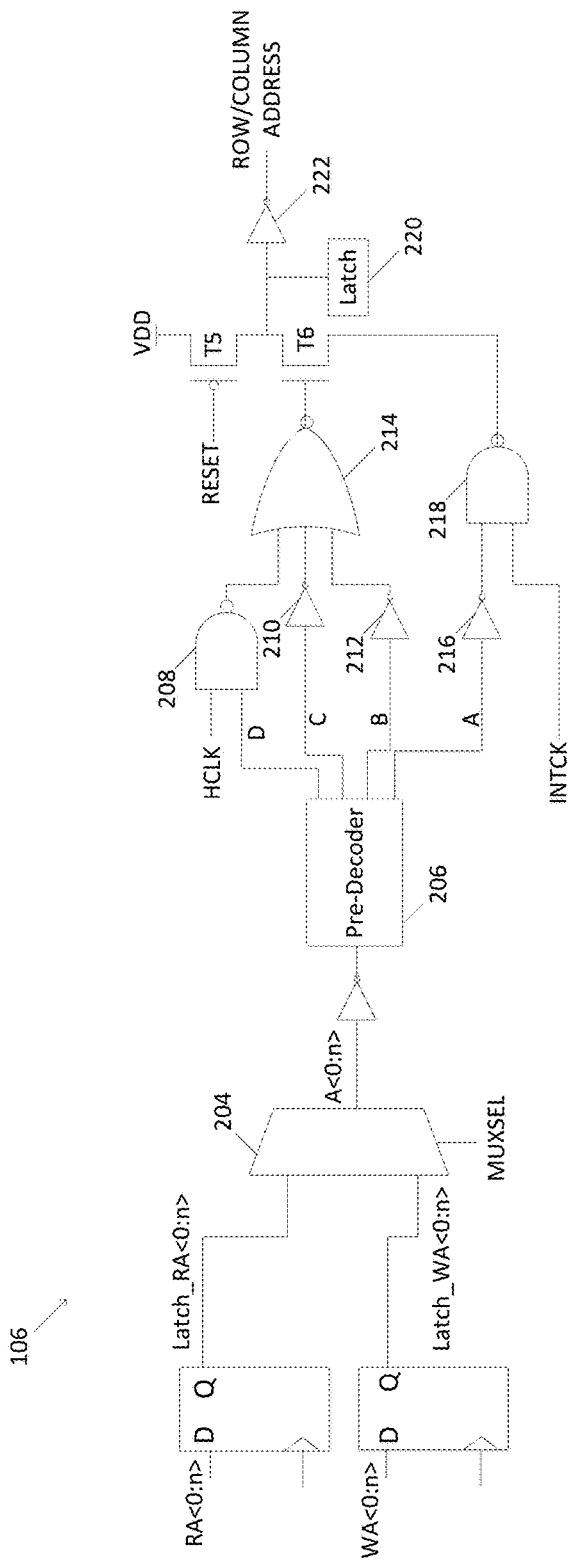
FIG. 6 is a schematic block diagram of the row pre-decoder of FIG. 2.

Details of the row and column pre-decoder 106 will now be given with additional reference to FIG. 6. The row and column pre-decoder 106 includes a read latch 200 configured to selectively latch the read address RA<0:n> for output to the multiplexer 204, and a write latch 202 configured to selectively latch the write address WA<0:n> for output to the multiplexer 204. The multiplexer 204 in turn provides output of the latched address A<0:n> to pre-decoder 206. The pre-decoder 206 splits the address A<0:n> into portions A, B, C, and D. A is fed through inverter 216 to NAND gate 218, which also receives the intCK signal as input. B is fed through inverter 212 to NOR gate 214. C is fed through inverter 210 to NOR gate 214. D is fed to NAND gate 208, which also receives the hold clock HCLK as input, and provides its output to NOR gate 214.

PMOS transistor T5 has its source coupled to the power node VDD, its drain coupled to the drain of NMOS transistor T6, and its gate coupled to reset signal RESET. NMOS transistor T6 has its source coupled to receive output from the NAND gate 218, and serves to output the decoded row and column address, through inverter 222, to the row decoder 54, and read-write multiplexers 64, 62.

The use of the RC tracking performed by the YCLKRC TRACK is now described. The memory control circuitry 100 may operate under a wide variety of operational conditions and temperatures. In order for pseudo-dual port mode to properly function, the global signals within the memory array 58, should be reset properly prior to beginning of the write operation after the read operation.

Figure 11:
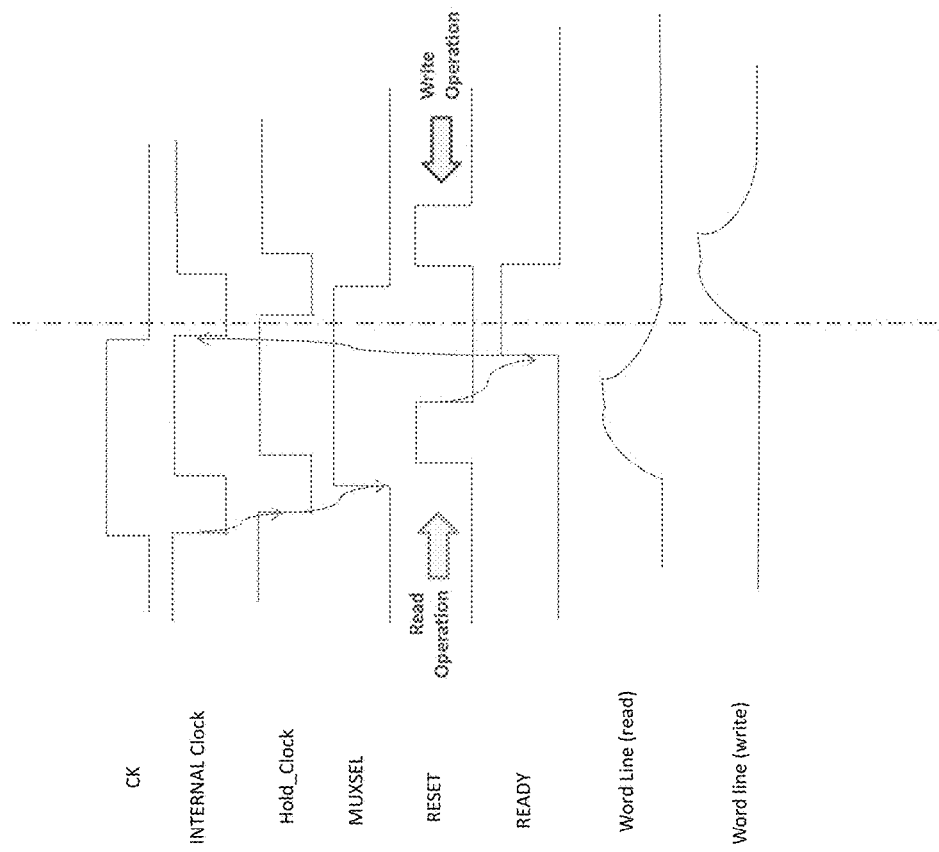
FIG. 11 is timing diagram showing a fault due to a lack of RC tracking.
Figure 12:
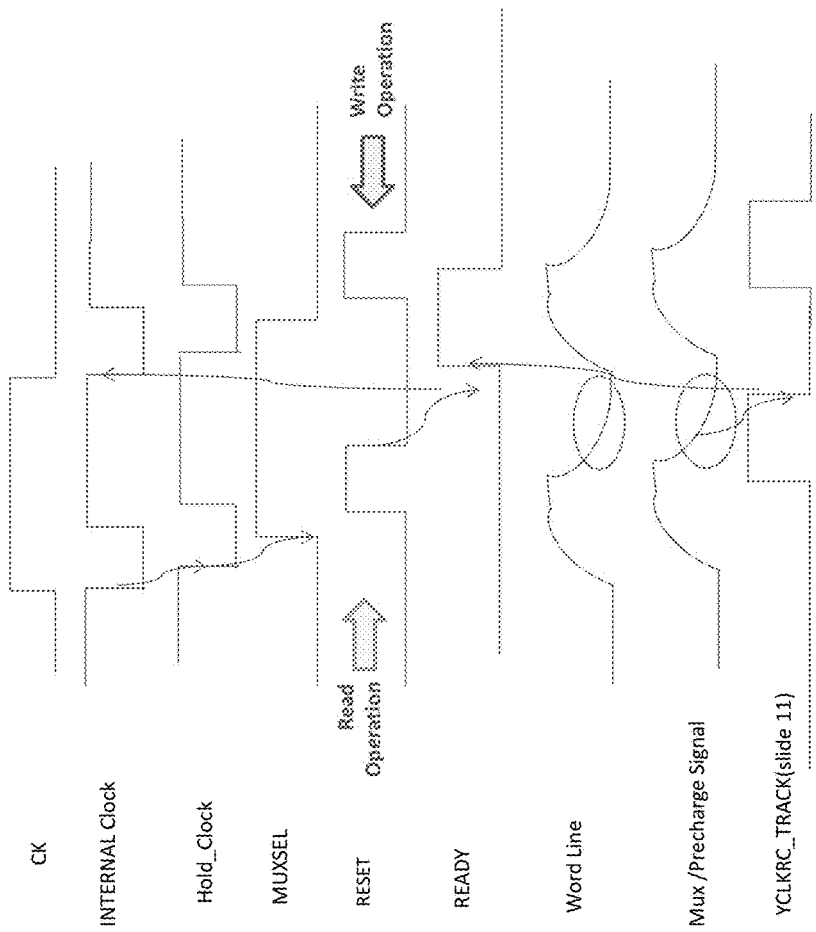
FIG. 12 is a timing diagram showing prevention of the fault using RC tracking.

Without tracking and compensating for the effects of parasitic capacitances, failure states, such as shown in FIG. 11, may occur in which the intCK and hold clock HCLK are generated prematurely, resulting in changing of the address A<0:n> during a read operation prior to completion of the read operation. By utilizing RC tracking, as shown in FIG. 12, this failure mode is avoided.

Figure 13:
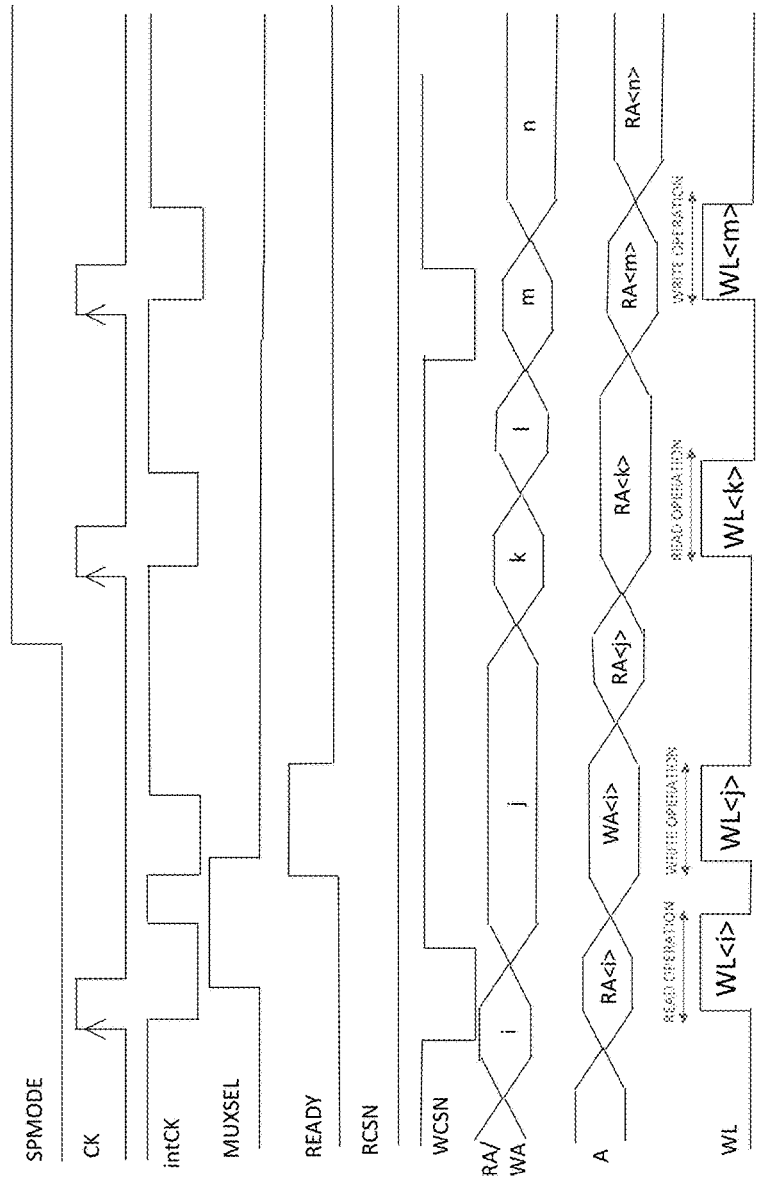
FIG. 13 is a timing diagram showing operation of the block diagram of FIG. 2, switching between single and dual port modes of operation.

The ability of the memory control circuitry 100 to switch dynamically between pseudo-dual port mode and single port mode can be observed in FIG. 13. To operate in single mode, referring back to the port control circuitry 300, MUXSEL is forced to a logic high, passing WEN.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A memory controller for a memory array having word lines and bit lines, the memory controller comprising:
   a row decoder configured to decode a row address and select a word line corresponding to the decoded row address;
   a row pre-decoder configured to output an address to the row decoder as the row address;
   a read-write clock generator configured to generate a hold clock signal; and
   an address clock generator configured to receive a read address, a write address, a dual port mode control signal, a read chip select signal, and a write chip select signal;
   wherein the address clock generator, when operating in dual port mode as indicated by the dual port mode control signal, and when operating in a read mode as indicated by the read chip select signal, is configured to latch the read address and output the read address to the row pre-decoder as the address as a function of the hold clock signal; and
   wherein the address clock generator, when operating in dual port mode as indicated by the dual port mode control signal, and when operating in a write mode as indicated by the write chip select signal, is configured to latch the write address and output the write address to the row pre-decoder as the address as a function of the hold clock signal.

2. The memory controller of claim 1, wherein the address clock generator is configured to latch the write address for output prior to completion of a read operation.

3. The memory controller of claim 1, wherein the address clock generator is configured to generate address clock signals; and wherein the row pre-decoder outputs the address to the row decoder in response to the received address clock signals.

4. The memory controller of claim 3, wherein the address clock generator comprises:
   address control circuitry configured to receive the read chip select signal, and the write chip select signal, and in response thereto, generate the address clock signals and a multiplexer (mux) select signal; and
   a multiplexer configured to multiplex the latched read address and to receive the latched write address to the row pre-decoder as the address, in response to the mux select signal.

5. The memory controller of claim 4, wherein the address control circuitry comprises:
   an address control block configured to receive the read chip select signal, and the write chip select signal, and in response thereto, generate a first clock output and a write only signal;
   a circuit block configured to generate the clock signals from the first clock output and the write only signal.

6. The memory controller of claim 5, wherein the circuit block comprises:
   a first inverter coupled to receive the first clock output and to generate therefrom a second clock output;
   a second inverter coupled to receive the second clock output and to generate therefrom a third clock output;
   a NAND gate configured to receive the first clock output and the write only signal and to generate therefrom a fourth clock output; and
   a third inverter coupled to the output of the NAND gate to generate a fifth clock output.

7. The memory controller of claim 5, wherein the address control block comprises:
   a first OR gate coupled to receive the read chip select signal and the write chip select signal;
   a first NOR gate coupled to receive output from the first OR gate and the mux select signal;
   a first latch configured to receive output from the first NOR gate as input and being clocked by the hold clock signal;

a first inverter configured to receive output from the first latch;

a second latch configured to receive output from the first inverter; and a first NAND gate configured to receive the write only signal, and output from the second latch, and to generate therefrom the mux select signal.

8. The memory controller of claim 7, further comprising a second OR gate coupled to receive the write chip select signal and an inverted form of the read chip select signal, and to generate therefrom the write only signal.

9. The memory controller of claim 6, further comprising:

a read flip flop configured to receive the read address and to latch the read address for output to the multiplexer until completion of a read operation;

a master write flip flop configured to receive the write address; and a slave write flip flop configured to receive output from the master write flip flop and configured to latch the write address for output to the multiplexer such that the write address is already latched when a write operation begins.

10. The memory controller of claim 9, wherein the read flip flop comprises:

a first clocked inverter having a data input receiving the read address as input, a first clock input receiving the second clock output, and a second clock input receiving the third clock output;

an inverter coupled to receive output from the first clocked inverter; and a second clocked inverter having a data input coupled to receive output from the inverter, a first clock input receiving the third clock output, a second clock input receiving the second clock output, and an output coupled to the multiplexer.

11. The memory controller of claim 9, wherein the master write flip flop comprises:

a first clocked inverter having a data input receiving the write address as input, a first clock input receiving the second clock output, and a second clock input receiving the third clock output;

an inverter coupled to receive output from the first clocked inverter; and a second clocked inverter having a data input coupled to receive output from the inverter, a first clock input receiving the third clock output, a second clock input receiving the second clock output, and an output;

wherein the slave write flip flop comprises:

a third clocked inverter having a data input coupled to receive output from the second clocked inverter, a first clock input receiving the fifth clock output, and a second clock input receiving the fourth clock output;

a second inverter coupled to receive output from the third clocked inverter; and a fourth clock inverter having a data input coupled to receive output from the second inverter, a first clock input receiving the fourth clock output, a second clock input receiving the fifth clock output, and an output coupled to the multiplexer.

12. The memory controller of claim 1, wherein the read-write clock generator comprises:

a first flop chain configured to receive the write chip select signal and being clocked by a latch clock;

a second flop chain configured to receive the read chip select signal and being clocked by the latch clock;

a first NOR gate coupled to receive output from the first and second flop chains;

a first NAND gate coupled to receive output from the first NOR gate;

a latch chain receiving output from the first NAND gate and being clocked by a reset signal and a complement thereof;

wherein the first NAND gate is also coupled to receive output from the latch chain;

a second NOR gate coupled to receive output from the latch chain and configured to receive a RC tracking signal;

a first transistor having a first conduction terminal coupled to an internal clock node, a second conduction terminal coupled to ground, and a gate terminal coupled to receive output from the second NOR gate; and a circuit block coupled to the internal clock node and configured to generate the hold clock signal.

13. The memory controller of claim 12, further comprising a RC tracking circuit configured to assert the RC tracking signal when a write is completed and when a read is completed.

14. The memory controller of claim 12, wherein the read-write clock generator further comprises:

a second transistor having a first conduction terminal coupled to a supply node, a second conduction terminal, and a gate terminal coupled to the reset signal;

a third transistor having a first conduction terminal coupled to the second conduction terminal of the second transistor, a second conduction terminal, and a gate terminal coupled to receive an external clock signal; and a fourth transistor having a first conduction terminal coupled to the second conduction terminal of the third transistor, a second conduction terminal coupled to ground, and a gate terminal coupled to receive a delayed version of the external clock signal;

wherein the second conduction terminal of the second transistor is also coupled to the internal clock node.

15. The memory controller of claim 1, wherein the row pre-decoder comprises:

a write latch configured to selectively latch the write address;

a read latch configured to selectively latch the read address;

a pre-decoder block configured to output first, second, third, and fourth address fragments;

a multiplexer configured to multiplex the write address and read address to the pre-decoder block;

a first NAND gate configured to receive the hold clock signal and the fourth address fragment;

a first inverter configured to receive the third address fragment;

a second inverter configured to receive the second address fragment; and a first NOR gate configured to receive output from the first NAND gate, the first inverter, and the second inverter.

16. The memory controller of claim 15, further comprising:

a third inverter configured to receive the first address fragment;

a second NAND gate configured to receive an output from the third inverter and a complement of an internal clock signal;

a first transistor having a first conduction terminal coupled to a supply node, a second conduction terminal, and a gate coupled to a reset signal;

a second transistor having a first conduction terminal coupled to the second conduction terminal of the first transistor, a second conduction terminal coupled to an output of the second NAND gate, and a gate coupled to an output of the first NOR gate; and a fourth inverter coupled to the second conduction terminal of the first transistor and configured to output the row address to the row decoder.

17. The memory controller of claim 1, wherein the memory array comprises an array of SRAM cells, each SRAM cell comprised of six transistor in a six transistor SRAM arrangement.

18. A memory controller for a memory array having word lines and bit lines, the memory controller comprising:

a read-write clock generator configured to generate a hold clock signal;

an address clock generator configured to receive a read address, a write address, a read chip select signal, and a write chip select signal;

wherein the address clock generator, when operating in a read mode as indicated by the read chip select signal, is configured to apply a read delay to the read address and output the read address, as delayed, as an address, in response to the hold clock signal; and wherein the address clock generator, when operating in a write mode as indicated by the write chip select signal, is configured to apply a write delay to the write address and output the write address, as delayed, as an address, prior to completion of a read operation, in response to the hold clock signal.

19. The memory controller of claim 18, wherein the read-write clock generator comprises:

a first flop chain configured to receive the write chip select signal and being clocked by a latch clock;

a second flop chain configured to receive the read chip select signal and being clocked by the latch clock;

a first NOR gate coupled to receive output from the first and second flop chains;

a first NAND gate coupled to receive output from the first NOR gate;

a latch chain receiving output from the first NAND gate and being clocked by a reset signal and a complement thereof;

wherein the first NAND gate is also coupled to receive output from the latch chain;

a second NOR gate coupled to receive output from the latch chain and configured to receive a RC tracking signal;

a first transistor having a first conduction terminal coupled to an internal clock node, a second conduction terminal coupled to ground, and a gate terminal coupled to receive output from the second NOR gate; and a block coupled to the internal clock node so as to generate the hold clock signal.

20. The memory controller of claim 19, further comprising a RC tracking circuit configured to assert the RC tracking signal when a write is completed and when a read is completed.

21. The memory controller of claim 19, wherein the read-write clock generator further comprises:

a second transistor having a first conduction terminal coupled to a supply node, a second conduction terminal, and a gate terminal coupled to the reset signal;

a third transistor having a first conduction terminal coupled to the second conduction terminal of the second transistor, a second conduction terminal, and a gate terminal coupled to receive an external clock signal; and a fourth transistor having a first conduction terminal coupled to the second conduction terminal of the third transistor, a second conduction terminal coupled to ground, and a gate terminal coupled to receive a delayed version of the external clock signal;

wherein the second conduction terminal of the second transistor is also coupled to the internal clock node.

* * * * *